US011139629B2

(12) United States Patent
Akutsu

(10) Patent No.: US 11,139,629 B2
(45) Date of Patent: Oct. 5, 2021

(54) METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/356,546

(22) Filed: Mar. 18, 2019

(65) Prior Publication Data

US 2019/0214781 A1 Jul. 11, 2019

Related U.S. Application Data

(62) Division of application No. 14/904,443, filed as application No. PCT/JP2014/069794 on Jul. 28, 2014, now abandoned.

(30) Foreign Application Priority Data

Jul. 29, 2013 (JP) ................................ 2013-157099

(51) Int. Cl.
*C08K 3/04* (2006.01)
*C08K 3/08* (2006.01)
(Continued)

(52) U.S. Cl.
CPC .............. *H01R 43/205* (2013.01); *C09J 7/20* (2018.01); *C09J 9/02* (2013.01); *H01R 4/04* (2013.01);
(Continued)

(58) Field of Classification Search
CPC ...... H01R 43/205; H01R 4/04; H01R 43/007; H01R 12/62; C09J 7/20; C09J 9/02;
(Continued)

(56) References Cited

U.S. PATENT DOCUMENTS

2003/0180508 A1* 9/2003 McArdle ................... G03F 7/34
428/195.1
2004/0177921 A1* 9/2004 Yamauchi ............... H01L 24/29
156/277

(Continued)

FOREIGN PATENT DOCUMENTS

JP H03-62411 A 3/1991
JP H04-251337 A 9/1992
(Continued)

OTHER PUBLICATIONS

Oct. 14, 2014 International Search Report issued in International Patent Application No. PCT/JP2014/069794.
(Continued)

*Primary Examiner* — Nathan L Van Sell
(74) *Attorney, Agent, or Firm* — Oliff PLC

(57) ABSTRACT

An anisotropic conductive film is capable of preventing a short circuit between terminals even though narrowing of the interval between connecting terminals advances. An electrically conductive support plate supports a base film having one surface with an adhesive layer. An array plate is disposed to face the adhesive layer and has through holes arranged in a pattern corresponding to the array pattern of electrically conductive particles. A spray sprays the electrically conductive particles together with a liquid while applying a voltage to the electrically conductive particles, in which the electrically conductive particles which are charged with an electrical charge are sprayed together with a liquid from the spray while applying a voltage between the spray and the support plate and the electrically conductive
(Continued)

particles which have passed through the through holes of the array plate are arranged on the adhesive layer in the array pattern of the through holes.

10 Claims, 7 Drawing Sheets

(51) Int. Cl.

| | | |
|---|---|---|
| C08K 7/18 | (2006.01) | |
| H01R 43/20 | (2006.01) | |
| C09J 9/02 | (2006.01) | |
| H01R 4/04 | (2006.01) | |
| H01R 43/00 | (2006.01) | |
| H05K 3/32 | (2006.01) | |
| C09J 7/20 | (2018.01) | |
| H01R 12/62 | (2011.01) | |
| H05K 3/14 | (2006.01) | |

(52) U.S. Cl.
CPC ............ *H01R 43/007* (2013.01); *H05K 3/323* (2013.01); *C08K 3/04* (2013.01); *C08K 3/08* (2013.01); *C08K 7/18* (2013.01); *C09J 2203/326* (2013.01); *C09J 2301/122* (2020.08); *C09J 2301/314* (2020.08); *H01R 12/62* (2013.01); *H05K 3/143* (2013.01); *H05K 2201/0224* (2013.01); *H05K 2203/1344* (2013.01)

(58) Field of Classification Search
CPC ............ C09J 2201/122; C09J 2201/602; C09J 2203/326; C09J 7/22; C09J 7/30; C09J 11/04; H05K 3/323; H05K 3/143; H05K 2201/0224; H05K 2203/1344; C08K 3/04; C08K 3/08; C08K 7/18
See application file for complete search history.

(56) References Cited

U.S. PATENT DOCUMENTS

| | | | | |
|---|---|---|---|---|
| 2007/0281161 A1* | 12/2007 | Ishida | ...................... | H01B 1/22 |
| | | | | 428/407 |
| 2009/0053859 A1* | 2/2009 | Xu | ........................... | H01B 1/22 |
| | | | | 438/118 |
| 2010/0101700 A1 | 4/2010 | Liang et al. | | |
| 2010/0188829 A1* | 7/2010 | Ito | ........................ | H05K 3/323 |
| | | | | 361/772 |
| 2012/0295098 A1 | 11/2012 | Hwang et al. | | |
| 2012/0328794 A1* | 12/2012 | Ito | ........................ | H05K 3/323 |
| | | | | 427/469 |

FOREIGN PATENT DOCUMENTS

| | | | | |
|---|---|---|---|---|
| JP | H06-223943 A | | 8/1994 | |
| JP | H11-121073 A | | 4/1999 | |
| JP | 2002-075580 A | | 3/2002 | |
| JP | 2005-216611 A | | 8/2005 | |
| JP | 2005-574939 | * | 8/2005 | ............... C09J 7/02 |
| JP | 2010-067360 A | | 3/2010 | |
| JP | 2010-251337 A | | 11/2010 | |
| JP | 4789738 B2 | | 10/2011 | |
| KR | 2009-0073366 A | | 7/2009 | |

OTHER PUBLICATIONS

Oct. 14, 2014 Written Opinion of the International Searching Authority issued in International Patent Application No. PCT/JP2014/069794.
Sep. 20, 2018 Office Action issued in Korean Patent Application No. 10-2018-7014039.
Nov. 4, 2020 Office Action issued in Chinese Patent Application No. 201811131779.5.
Jul. 23, 2021 Office Action issued in Chinese Patent Application No. 201811131779.5.

* cited by examiner

METHOD FOR MANUFACTURING ELECTRICALLY CONDUCTIVE ADHESIVE FILM, ELECTRICALLY CONDUCTIVE ADHESIVE FILM, AND METHOD FOR MANUFACTURING CONNECTOR

CROSS-REFERENCE TO RELATED APPLICATION(S)

This application is a divisional of U.S. application Ser. No. 14/904,443 filed Jan. 12, 2016, which is based on and claims priority under 35 U.S.C. 119 from Japanese Patent Application No. 2013-157099 filed in the Japan Patent Office on Jul. 29, 2013. The contents of the above applications are incorporated herein by reference.

TECHNICAL FIELD

The present invention relates to an electrically conductive adhesive, particularly relates to a method for manufacturing an electrically conductive adhesive film that is suitably usable in anisotropic conductive connection, an electrically conductive adhesive film manufactured by using this manufacturing method, and a method for manufacturing a connector using this electrically conductive adhesive film.

BACKGROUND ART

Hitherto, an anisotropic conductive film obtained by molding a binder resin in which electrically conductive particles are dispersed into a film is used as an adhesive when connecting a rigid substrate such as a glass substrate or a glass epoxy substrate to a flexible substrate or an IC chip or when connecting flexible substrates to each other. When the case of connecting the connecting terminal of a flexible substrate to the connecting terminal of a rigid substrate is described as an example, as illustrated in FIG. 7(A), an anisotropic conductive film 53 is disposed between the regions in which both connecting terminals 52 and 55 of a flexible substrate 51 and a rigid substrate 54 are formed, a buffer material 50 is appropriately disposed on the flexible substrate 51, and the substrates 51 and 54 are heat-pressurized from the top of the flexible substrate 51 by a heating and pressing head 56. By virtue of this, as illustrated in FIG. 7(B), the binder resin becomes fluid to flow out from between the connecting terminal 52 of the flexible substrate 51 and the connecting terminal 55 of the rigid substrate 54 and also the electrically conductive particles in the anisotropic conductive film 53 are pressed and deformed by being sandwiched between the two connecting terminals.

As a result, the connecting terminal 52 of the flexible substrate 51 and the connecting terminal 55 of the rigid substrate 54 are electrically connected to each other via the electrically conductive particles, and the binder resin is cured in this state. The electrically conductive particles that are not present between the two connecting terminals 52 and 55 are dispersed in the binder resin and maintained in the electrically isolated state. By virtue of this, it is possible to achieve electrical conduction only between the connecting terminal 52 of the flexible substrate 51 and the connecting terminal 55 of the rigid substrate 54.

CITATION LIST

Patent Literatures

Patent Literature 1: JP 04-251337 A
Patent Literature 2: JP 2010-251337 A
Patent Literature 3: JP 4789738 B1

SUMMARY OF INVENTION

Technical Problem

In recent years, high density mounting of electronic components has advanced in association with the miniaturization and thinning mainly of small-sized portable electronic devices such as a mobile phone or a smart phone, a tablet PC, and a notebook computer, and the microminiaturization of the connecting terminals and the narrowing of the interval between the adjacent connecting terminals have advanced in a so-called FOB (Film on Board) connection to connect a flexible substrate to a main substrate or a so-called FOF (Film on Film) connection to connect flexible substrates to each other. In addition, the microminiaturization of the connecting terminals due to an increase in terminals associated with high definition of the screen and miniaturization of the control IC and the narrowing of the interval between the adjacent connecting terminals have advanced in a so-called COG (Chip on Glass) connection to connect the control IC of a liquid crystal screen to the ITO wiring of a glass substrate.

As such microminiaturization of the connecting terminals associated with the requirement of high density mounting and the narrowing of the interval between connecting terminals advance, it is concerned that the electrically conductive particles are linked to one another between the micro terminals to cause a short circuit between the terminals since the electrically conductive particles are randomly dispersed in the binder resin in the anisotropic conductive film of prior art.

In order to cope with such a problem, a decrease in particle size of the electrically conductive particles and a method to form an insulating film on the particle surface have been proposed, but it is concerned that the particle capture rate on the microminiaturized connecting terminal decreases when the particle size of the electrically conductive particles decreases, and it is not possible to completely prevent the short circuit between the terminals in the case of forming the insulating film. Furthermore, as illustrated in FIG. 8(A), a method to separate the electrically conductive particles 57 from one another through biaxial stretching has also been proposed, but not all of the electrically conductive particles are separated, as illustrated in FIG. 8(B), the aggregate of particles 58 in which a plurality of electrically conductive particles 57 are linked to one another remains, and thus it is not possible to completely prevent a short circuit between the terminals generated between the adjacent terminals 55, 55.

Accordingly, an object of the invention is to provide a method for manufacturing an electrically conductive adhesive film which can capture electrically conductive particles in a microminiaturized connecting terminal as well as prevent a short circuit between terminals even though microminiaturization of the connecting terminal and the narrowing of the interval between connecting terminals advance and thus can meet the requirement of high density mounting, an electrically conductive adhesive film, and a method for manufacturing a connector.

Solution to Problem

In order to solve the above problem, a method for manufacturing an electrically conductive adhesive film according to the invention is a method which includes steps of providing an electrically conductive support plate to support a first base film having an adhesive layer formed on a surface, providing an array plate that is disposed to face the adhesive layer of the first base film supported by the support plate and has a plurality of through holes arranged in a pattern corresponding to an array pattern of electrically conductive particles formed thereon, providing a spray that is disposed on a side opposite to a side facing the support plate of the array plate and sprays electrically conductive particles together with a liquid while applying a voltage to the electrically conductive particles, spraying the electrically conductive particles charged with an electrical charge together with a liquid from the spray while applying a voltage between the spray and the support plate supporting a surface on the opposite side to a surface on which the adhesive layer is formed of the first base film, and arranging the electrically conductive particles which passed through the through holes of the array plate on the adhesive layer in an array pattern of the through holes.

In addition, an electrically conductive adhesive film according to the invention is one that is manufactured by the manufacturing method described above.

In addition, a method for manufacturing a connector according to the invention is a method for manufacturing a connector obtained by connecting a plurality of terminals arranged in parallel to one another by an anisotropic conductive film having electrically conductive particles arranged therein, in which the anisotropic conductive film is manufactured by steps of: providing an electrically conductive support plate to support a base film having an adhesive layer formed on a surface; providing an array plate that is disposed to face the adhesive layer of the base film supported by the support plate and has a plurality of through holes arranged in a pattern corresponding to an array pattern of electrically conductive particles formed thereon; providing a spray that is disposed above the array plate and sprays electrically conductive particles together with a liquid while applying a voltage to the electrically conductive particles; spraying the electrically conductive particles charged with an electrical charge together with a liquid from the spray while applying a voltage between the spray and the support plate to support the base film in a state in which the adhesive layer is turned upward; and arranging the electrically conductive particles which passed through the through holes of the array plate on the adhesive layer in an array pattern of the through holes.

Advantageous Effects of Invention

According to the invention, it is possible to equally disperse and dispose the electrically conductive particles on the adhesive layer since the electrically conductive particles are arranged in a desired pattern in advance, and this makes it possible to provide an electrically conductive adhesive film which can capture the electrically conductive particles in the microminiaturized connecting terminal as well as prevent a short circuit between terminals even though microminiaturization of the connecting terminal and the narrowing of the interval between connecting terminals advance and thus can meet the requirement of high density mounting.

BRIEF DESCRIPTION OF DRAWINGS

FIGS. 7(A) and 7(B) are cross-sectional views illustrating the manufacturing process of a connector using an anisotropic conductive film of prior art, in which FIG. 7(A) illustrates the state before pressure joining, and FIG. 7(B) illustrates the state after pressure joining.

FIGS. 8(A) and 8(B) are views illustrating a technique to separate the interval between the electrically conductive particles by biaxial stretching, in which FIG. 8(A) illustrates the state of the electrically conductive particles before being stretched, and FIG. 8(B) illustrates the state that the aggregate of particles remains after stretching.

DESCRIPTION OF EMBODIMENTS

Hereinafter, the method for manufacturing an electrically conductive adhesive film, an electrically conductive adhesive film, and a method for manufacturing a connector to which the invention is applied will be described in detail with reference to the accompanying drawings. Incidentally, the invention is not intended to be limited only to the following embodiments, but it should be understood that the various changes, substitutions, and alterations could be made hereto without departing from the spirit and scope of the invention. In addition, the drawings are schematic, and the ratio and the like of the respective dimensions may be different from the reality. The specific dimensions and the like should be judged in consideration of the following description. Moreover, it should be understood that the drawings include portions in which the relationships and ratios of the dimensions are different from one another.

Anisotropic Conductive Film

The electrically conductive adhesive film to which the invention is applied is suitably used as an anisotropic conductive film 1 for achieving conduction between connecting terminals as electrically conductive particles are equally dispersed and disposed on a binder resin to be an adhesive in a predetermined pattern and the electrically conductive particles are sandwiched between the connecting terminals facing each other. In addition, as the connector using an electrically conductive adhesive film to which the invention is applied is, for example, a connector in which an IC or a flexible substrate is COG, FOB, or FOF connected using the anisotropic conductive film 1 and another connector, and the connector can be suitably used in any devices such as television, or PC, mobile phones, game machines, audio devices, and tablet terminators, or vehicle-mounted monitors.

The anisotropic conductive film 1 is a thermosetting adhesive or a photocurable adhesive such as an ultraviolet curable adhesive, is fluidized by being heated and pressurized by a pressure tool (not illustrated) so that the electrically conductive particles are pressed and deformed between the connecting terminals facing to each other, and is cured by being heated or irradiated with ultraviolet rays in a state in which the electrically conductive particles are pressed and deformed. By virtue of this, the anisotropic conductive film 1 electrically and mechanically connects an IC or a flexible substrate to a connecting target such as a glass substrate.

Figure 1:
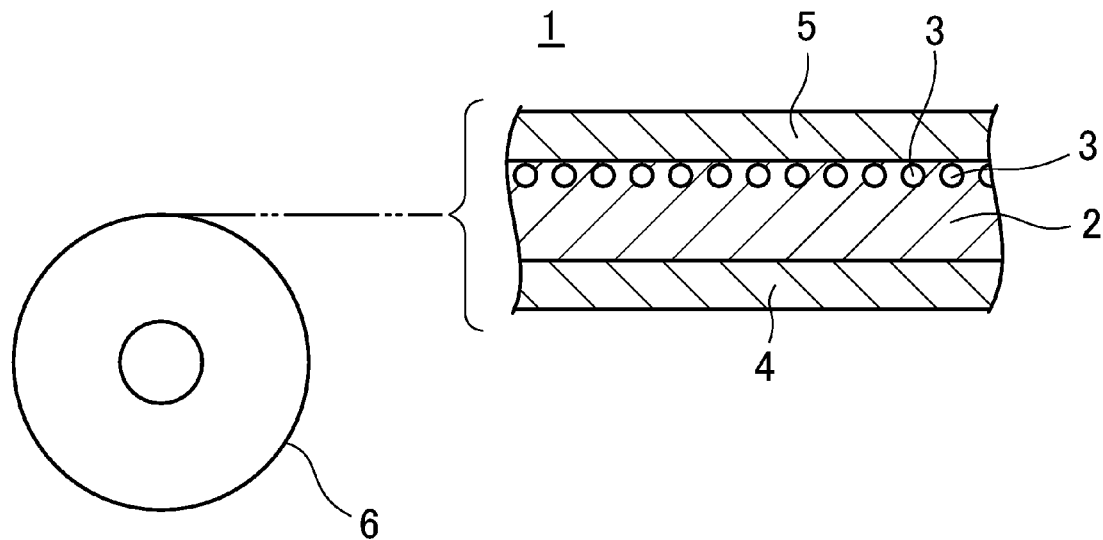
FIG. 1 is a cross-sectional view illustrating an anisotropic conductive film to which the invention is applied.

The anisotropic conductive film 1 is one, for example, as illustrated in FIG. 1, in which electrically conductive particles 3 are disposed on an ordinary binder resin 2 (adhesive) containing a film-forming resin, a thermosetting resin, a latent curing agent, a silane coupling agent, and the like in a predetermined pattern and this thermosetting adhesive composition is supported by first and second base films 4 and 5 of an upper and lower pair.

The first and second base films 4 and 5 are formed, for example, by coating a release agent such as silicone on PET (Poly Ethylene Terephthalate), OPP (Oriented Polypropylene), PMP (Poly-4-methylpentene-1), PTFE (Polytetrafluoroethylene), and the like.

As the film forming resin contained in the binder resin 2, a resin having an average molecular weight of about from 10000 to 80000 is preferable. Examples of the film forming resin may include various kinds of resins such as an epoxy resin, a modified epoxy resin, a urethane resin, and a phenoxy resin. Among them, a phenoxy resin is even more preferable from the viewpoint of the film formed state, connection reliability, and the like.

The thermosetting resin is not particularly limited, and examples thereof may include an epoxy resin and an acrylic resin that are commercially available.

The epoxy resin is not particularly limited, and examples thereof may include a naphthalene type epoxy resin, a biphenyl type epoxy resin, a phenol novolak type epoxy resin, a bisphenol type epoxy resin, a stilbene type epoxy resin, a triphenol methane type epoxy resin, a phenol aralkyl type epoxy resin, a naphthol type epoxy resin, a dicyclopentadiene type epoxy resin, and a triphenylmethane type epoxy resin. These may be a single substance or a combination of two or more kinds thereof.

The acrylic resin is not particularly limited, and an acrylic compound, a liquid acrylate, and the like can be appropriately selected depending on the purpose. Examples thereof may include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. In addition, it is also possible to use those in which acrylate is converted to methacrylate. These may be used singly or two or more kinds thereof may be used concurrently.

The latent curing agent is not particularly limited, and examples thereof may include various kinds of curing agents of a heat curing type, a UV curing type, and the like. The latent curing agent does not react under a normal condition, but it is activated by various kinds of triggers which are selected depending on the application, such as heat, light, and pressurization and starts to react. As the method for activating a thermally activated latent curing agent, there are a method in which active species (a cation or an anion, and a radical) are produced through the dissociation reaction caused by heating, and the like, a method in which the latent curing agent is stably dispersed in an epoxy resin at around room temperature, but at a higher temperature, it is compatible with and dissolves in the epoxy resin to start the curing reaction, a method in which a molecular sieve encapsulation type curing agent is eluted at a high temperature to start the curing reaction, a method of elution and curing by a microcapsule, and the like. Examples of the thermally activated latent curing agent may include imidazole-based one, hydrazide-based one, a boron trifluoride-amine complex, a sulfonium salt, an amine imide, a polyamine salt, dicyandiamide, and any modified product thereof, and these may be a single substance or a mixture of two or more kinds thereof. Among them, the microcapsule type imidazole-based latent curing agent is preferable.

The silane coupling agent is not particularly limited, and examples thereof may include epoxy-based one, amino-based one, mercapto and sulfide-based one, and ureido-based one. The adhesive property at the interface between an organic material and an inorganic material is improved by adding a silane coupling agent.

Electrically Conductive Particles

Examples of the electrically conductive particles 3 may include particles of various kinds of metals such as nickel, iron, copper, aluminum, tin, lead, chromium, cobalt, silver, and gold, or particles of a metal alloy, a metal oxide, those obtained by coating a metal on the surface of particles of carbon, graphite, glass, a ceramic, a plastic, or the like. In the case of those obtained by coating a metal on the surface of resin particles, examples of the resin particles may include particles of an epoxy resin, a phenolic resin, an acrylic resin, an acrylonitrile-styrene (AS) resin, a benzoguanamine resin, a divinylbenzene-based resin, and a styrene-based resin.

Figure 2:
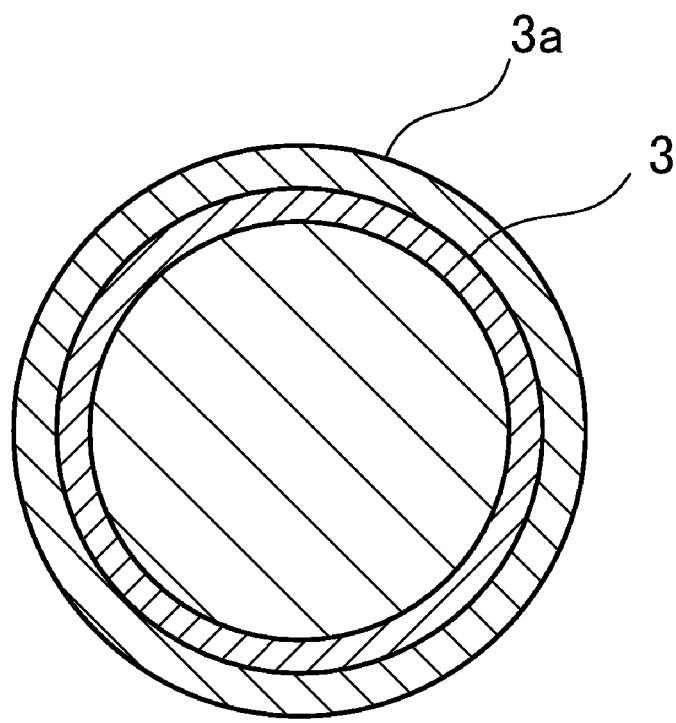
FIG. 2 is a cross-sectional view illustrating electrically conductive particles used in the invention.

As illustrated in FIG. 2, an insulating film 3a is formed as the surface of the electrically conductive particles 3 is covered with an insulating material. This makes it possible for the electrically conductive particles 3 to charge the insulating film 3a with an electrical charge.

Examples of the insulating material constituting the insulating film 3a may include various polymers such as an acrylic polymer, a urethane-based polymer, an epoxy-based polymer, an imide-based polymer, and an amide-based polymer. In addition, examples of the method for forming the insulating film may include a "hybridization treatment". The hybridization treatment is to composite fine particles with fine particles and is one in which the fixation and film forming treatment of particles are conducted by applying mechanical heat energy mainly composed of an impact force to the particles while dispersing the mother particles and the child particles in the gas phase.

Film Thickness of Insulating Film

In addition, it is preferable that the insulating film 3a is formed to have a film thickness of from 0.1 to 50% of the particle size of the electrically conductive particles 3. As to be described later, the electrically conductive particles 3 are required to be arranged on the binder resin 2 in a state of being charged, and thus it is concerned that the electrostatic property of the insulating film 3a is lost before the electrically conductive particles 3 are attached to the binder resin 2 when the thickness of the insulating film 3a that is charged with an electrical charge is thin and it is not possible to arrange the electrically conductive particles 3 in a predetermined pattern. On the other hand, the conduction resistance between the connecting terminals increases when the insulating film 3a of the electrically conductive particles 3 is too thick. Hence, it is preferable to form the insulating film 3a in a thickness of from 0.1 to 50% of the particle size of the electrically conductive particles 3.

Specifically, the film thickness of the insulating film 3a can be decided based on the dielectric constant of the material constituting the insulating film 3a. For example, in the case of using (material name: polymethyl methacrylate, dielectric constant: 3) as the insulating film 3a that is formed on the surface of the electrically conductive particles 3 having an average particle size of 4 µm, the film thickness can be set to approximately from 0.004 to 2.0 µm.

In the anisotropic conductive film 1, as to be described later, the electrically conductive particles 3 are regularly arranged in a predetermined array pattern and thus the occurrence of coarseness and fineness due to aggregation of the electrically conductive particles is prevented. Hence, according to the anisotropic conductive film 1, it is possible to prevent a short circuit between terminals by aggregates of the electrically conductive particles even though the narrowing of the interval between connecting terminals advances, it is also possible to capture the electrically conductive particles even in a microminiaturized connecting terminal and thus to meet the requirement of high density mounting.

Incidentally, the shape of the anisotropic conductive film 1 is not particularly limited, and for example, it may have a long tape shape capable of being wound around a take-up reel 6 as illustrated in FIG. 1 so that it may be cut by a predetermined length for use.

In addition, in the embodiment described above, the anisotropic conductive film 1 has been described by taking an adhesive film obtained by molding a thermosetting resin composition containing the electrically conductive particles 3 in the binder resin 2 in a film shape as an example, but the adhesive according to the invention is not limited thereto, and for example, it may have a configuration in which an insulating adhesive layer composed of only the binder resin 2 and an electrically conductive particle-containing layer composed of the binder resin 2 containing the electrically conductive particles 3 are laminated.

Method for Manufacturing Anisotropic Conductive Film

Next, the method for manufacturing the anisotropic conductive film 1 will be described. The manufacturing process of the anisotropic conductive film 1 includes a step of arranging the electrically conductive particles 3 on the binder resin 2 formed on one surface of the first base film 4 in a predetermined pattern. The electrically conductive particles 3 arranged on the binder resin 2 are pushed into the binder resin 2 as the second base film 5 is laminated on the surface on which the electrically conductive particles 3 are arranged of the binder resin 2.

Figure 3:
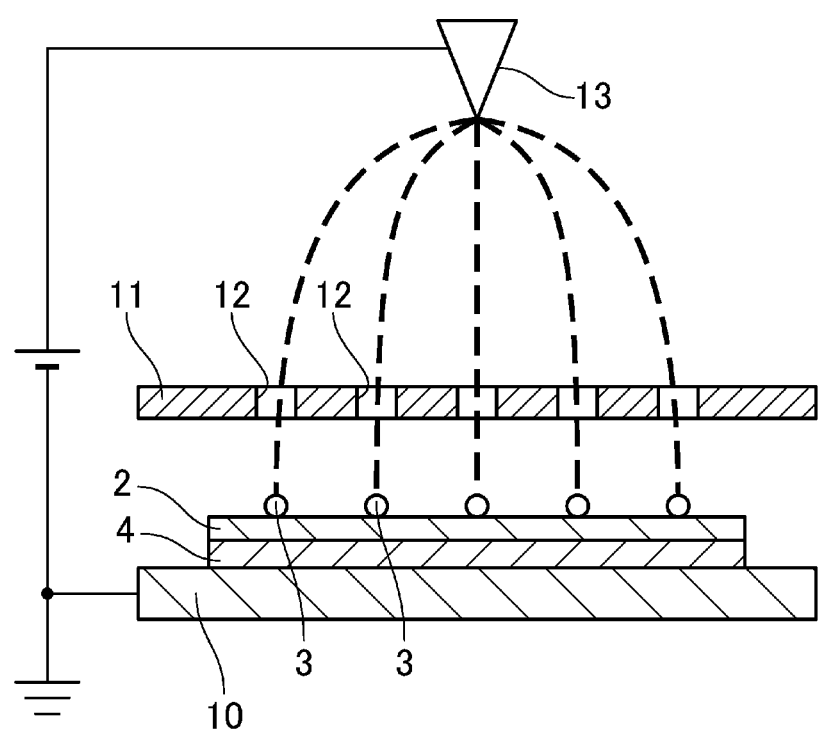
FIG. 3 is cross-sectional view illustrating a step of arranging the electrically conductive particles in the manufacturing process of an anisotropic conductive film.

In the step of arranging the electrically conductive particles, as illustrated in FIG. 3, an electrically conductive support plate 10 to support the first base film 4 of which one surface is provided with the binder resin 2, an array plate 11 which is disposed to face the binder resin 2 of the first base film 4 supported by the support plate 10 and on which a plurality of through holes 12 arranged in a pattern corresponding to the array pattern of the electrically conductive particles 3 are formed, and a spray 13 which is disposed above the array plate 11 and sprays the charged electrically conductive particles 3 together with a liquid while applying a voltage to the electrically conductive particles 3 are used.

The support plate 10 is one that allows the charged electrically conductive particles 3 to adsorb to the binder resin 2 that is provided to the first base film 4 as a voltage is applied between the support plate 10 and the spray 13, and the support plate 10 is formed of a nickel plate, for example. The material of the support plate 10 is not limited as long as it exhibits conductivity.

The array plate 11 is one that arranges the electrically conductive particles 3 which have passed through the through holes 12 on the surface of the binder resin 2 in the array pattern of the through holes 12 as the array plate 11 is disposed close onto the binder resin 2. On the array plate 11, a plurality of through holes 12 are formed in accordance with a predetermined array pattern of the electrically conductive particles 3. For example, the array plate 11 has a plurality of through holes formed in a lattice shape at equal intervals. By virtue of this, the electrically conductive particles that have passed through the through holes 12 are equally disposed on the surface of the binder resin 2 in a lattice pattern. Incidentally, the through holes 12 can be formed using a known processing technology such as laser processing.

The opening size of the through holes 12 is 100% or more of the average particle size of the electrically conductive particles 3 and preferably from 120 to 200% of the average particle size of the electrically conductive particles 3. It is difficult for the electrically conductive particles 3 to pass through the through holes 12 when the opening size of the through holes 12 is less than 100% of the average particle size of the electrically conductive particles 3. In addition, when the opening size of the through holes 12 is 200% or more of the average particle size of the electrically conductive particles 3, it is concerned that a plurality of electrically conductive particles 3 pass through one through hole 12, it is not possible to equally disperse and dispose the electrically conductive particles, and also it is concerned that the aggregation of particles is caused.

The charging of the array plate 11 is prevented so that the passing of the charged electrically conductive particles 3 via the through holes 12 will not be impeded by attraction or repulsion. For example, the array plate 11 is prevented from being charged as it is grounded as well as formed using an electrically conductive material such as nickel. Alternatively, the array plate 11 may be prevented from being charged as it is formed using a hardly charged material.

The spray 13 is provided above the array plate 11 and sprays the electrically conductive particles 3 dispersed in a liquid such as water together with the liquid via the array plate 11 toward the binder resin 2 of the first base film 4 that is supported by the support plate 10. At this time, the spray 13 applies an electrical charge to have a polarity opposite to the voltage applied to the support plate 10 to the electrically conductive particles 3. The spray 13 can charge the electrically conductive particles 3, for example, by conducting corona discharge at the nozzle tip.

In order to arrange the electrically conductive particles 3 on the binder resin 2 formed on one surface of the first base film 4 in a predetermined pattern using these support plate 10, array plate 11, and spray 13, the electrically conductive particles 3 which are charged with an electrical charge are sprayed together with the liquid from the spray 13 while applying a voltage between the spray 13 and the support plate 10 to support the first base film 4 in a state in which the binder resin 2 is turned upward.

Figure 4A:
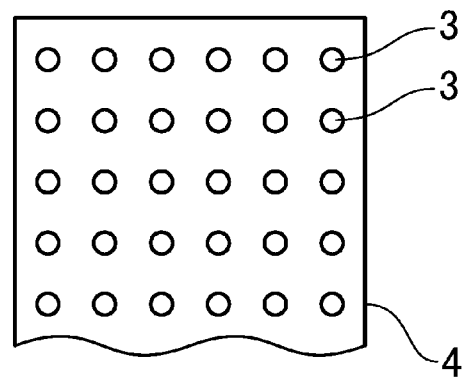
FIGS. 4(A) to 4(C) are cross-sectional views illustrating a step of laminating after the electrically conductive particles are arranged.
Figure 4A:

The ejected electrically conductive particles 3 pass through the through holes 12 of the array plate 11 as well as are uniformly dispersed by the static electricity, and are attached onto the surface of the binder resin 2 on the first base film 4 supported by the support plate 10 to which the opposite polarity is applied in a pattern corresponding to the array pattern of the through holes 12 (FIG. 4(A)). Incidentally, the moisture attached to the electrically conductive particles 3 is thrown off from the surface of the electrically conductive particles 3 during a fall.

Film Thickness of Insulating Film 3a

Here, the electrically conductive particles 3 are attached onto the surface of the binder resin 2 by being attracted to the support plate 10 to which the opposite polarity is applied, and thus the electrically conductive particles 3 are required to be charged with an electrical charge at least until being attached onto the surface of the binder resin 2. Hence, as described above, as the insulating film 3a to be charged with an electrical charge is formed so as to have a film thickness of 0.1% or more of the particle size of the electrically conductive particles 3, the electrically conductive particles 3 do not lose the electrostatic property before being attached to the binder resin 2 and are securely and equally dispersed and disposed in accordance with the pattern of the through holes 12 of the array plate 11. On the other hand, the conduction resistance between the connecting terminals increases when the insulating film 3a of the electrically conductive particles 3 is too thick. Hence, it is preferable to form the insulating film 3a in a thickness of from 0.1 to 50% of the particle size of the electrically conductive particles 3.

In addition, the respective electrically conductive particles 3 are charged with an electrical charge having the same polarity and thus repel one another. This makes it possible to prevent a plurality of electrically conductive particles 3 from passing through one through hole 12, and the electrically conductive particles 3 are arranged on the surface of the binder resin 2 in a single layer in accordance with the pattern of the through holes 12.

Figure 4B:
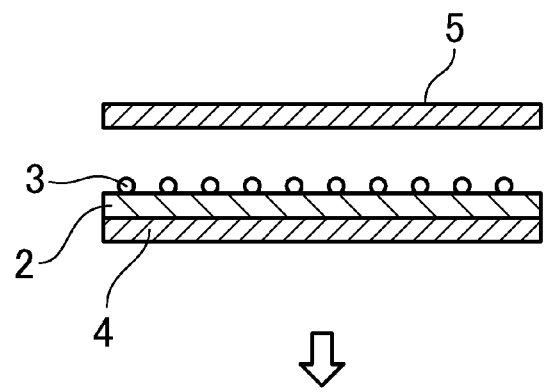
Figure 4B:

After the electrically conductive particles 3 are arranged in a predetermined pattern corresponding to the pattern of the through holes 12, the second base film 5 is laminated on the binder resin 2 on which the electrically conductive particles 3 are arranged (FIG. 4(B)).

The second base film 5 pushes the electrically conductive particles 3 into the binder resin 2 so as to achieve the positioning of the electrically conductive particles 3. The electrically conductive particles 3 are held in the binder resin 2 that is coated on the first and second base films 4 and 5 as the release treated surface of the second base film 5 is bonded to the surface on which the electrically conductive particles 3 are transferred of the binder resin 2. By virtue of this, the anisotropic conductive film 1 is formed in which the binder resin 2 containing the electrically conductive particles 3 is supported by the first base films 4 and 5 of an upper and lower pair.

Figure 4C:
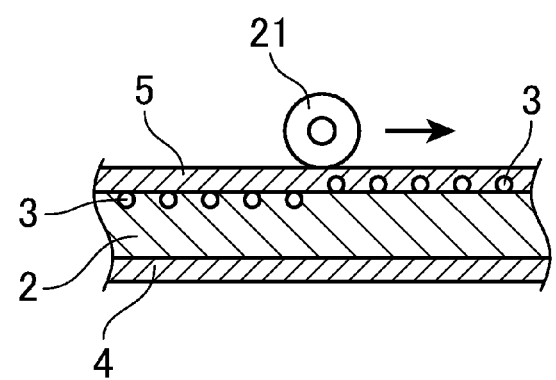

As illustrated in FIG. 4(C), the electrically conductive particles 3 are pushed into the binder resin 2 as the anisotropic conductive film 1 is appropriately pressed by a laminating roll 21. Subsequently, the surface on which the electrically conductive particles 3 are pushed of the binder resin 2 is cured by being irradiated with ultraviolet rays from the first base film 4 side, and the like, and thus the anisotropic conductive film 1 is fixed in the pattern arranged with the electrically conductive particles 3.

Manufacturing Process of Connector

The anisotropic conductive film 1 can be suitably used in a connector in which an IC or a flexible substrate is COG, FOB, or FOF connected and any devices such as television, or PC, mobile phones, game machines, audio devices, and tablet terminators, or vehicle-mounted monitors.

Figure 5:
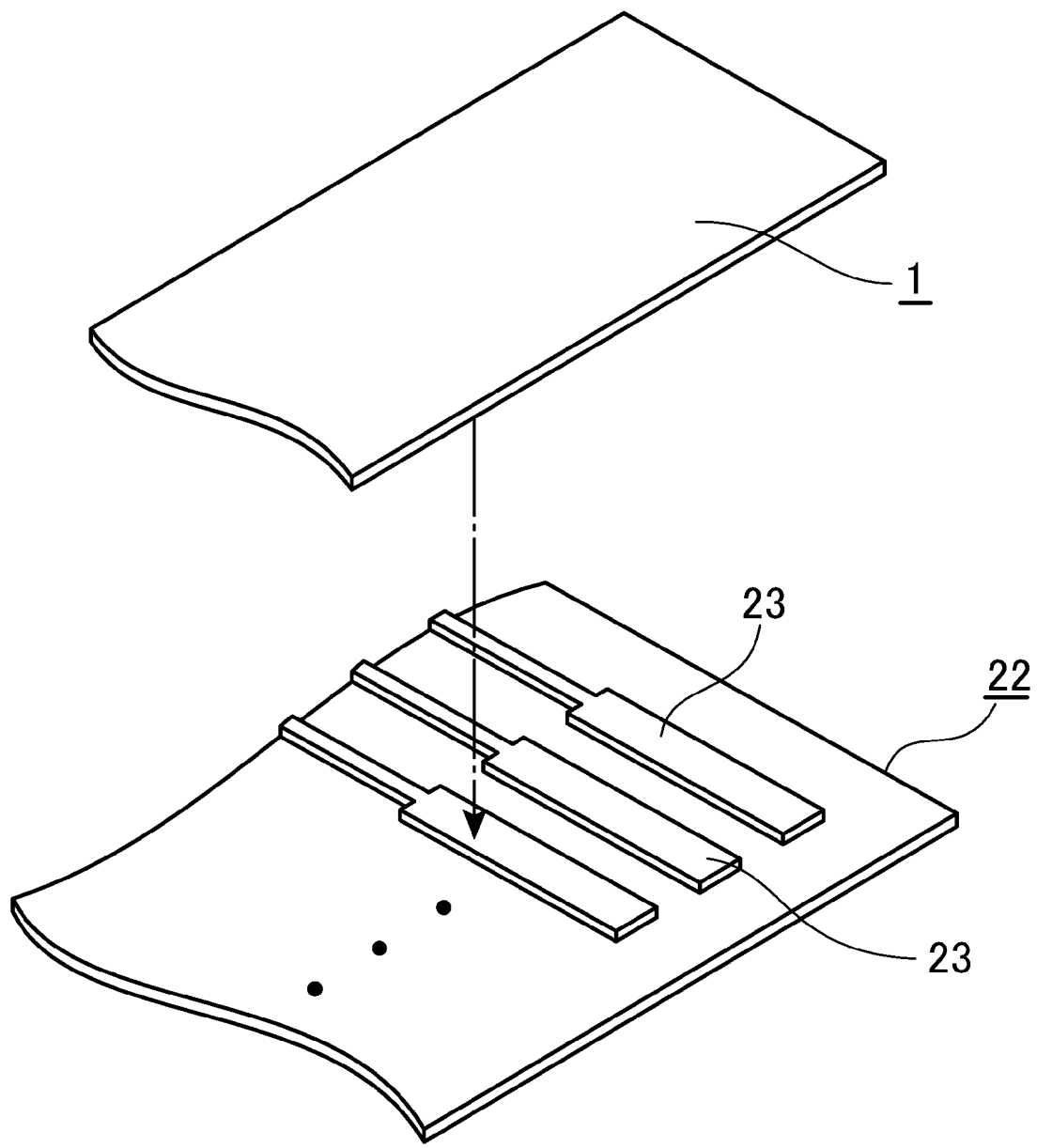
FIG. 5 is a perspective view illustrating a state in which an anisotropic conductive film is pasted to a rigid substrate having a plurality of connecting terminals arranged in parallel.

As illustrated in FIG. 5, a rigid substrate 22 that is connected to an IC or a flexible substrate via the anisotropic conductive film 1 is formed of a plurality of connecting terminals 23 arranged in parallel. These connecting terminals 23 are microminiaturized to meet the requirement of high density mounting and the interval between the connecting terminals is narrowed.

At the time of actual use, the anisotropic conductive film 1 is cut such that the size in the width direction corresponds to the size of the connecting terminal 23, the first base film 4 is then peeled off therefrom, and the anisotropic conductive film 1 thus cut is pasted on the plurality of connecting terminals 23 by taking the parallel direction of the connecting terminals 23 as the longitudinal direction. Subsequently, the connecting terminal of the IC or flexible substrate side is mounted on the connecting terminal 23 via the anisotropic conductive film 1, and the resultant is heated and pressurized by a pressure tool (not illustrated) from the top of it.

By virtue of this, the binder resin 2 is softened, the electrically conductive particles 3 are pressed and deformed between the connecting terminals facing each other, and the anisotropic conductive film 1 is cured in a state in which the electrically conductive particles 3 are pressed and deformed by being heated or irradiated with ultraviolet rays. By virtue of this, the anisotropic conductive film 1 electrically and mechanically connects an IC or a flexible substrate to a connecting target such as a glass substrate.

Here, in the anisotropic conductive film 1, the electrically conductive particles 3 are equally arranged in a lattice shape throughout the longitudinal direction. Hence, it is possible to improve the conduction properties as the anisotropic conductive film 1 is securely captured on the microminiaturized connecting terminals 23, and also it is possible to prevent a short circuit between adjacent terminals as the electrically conductive particles 3 are not linked to one another in the narrowed intervals between connecting terminals.

Content of Aggregate

Incidentally, as described above, according to the invention, the electrically conductive particles 3 ejected from the spray 13 pass through the through holes 12 of the array plate 11 as well as are uniformly dispersed by the static electricity, and are attached onto the surface of the binder resin 2 on the first base film 4 in a pattern corresponding to the array pattern of the through holes 12 (FIG. 4(A)).

At this time, aggregates in which a plurality of electrically conductive particles 3 are linked to one another is within 15%, preferably within 8%, more preferably 5% of the total number of electrically conductive particles. The size of the aggregate is set to be preferably 8 times or less and more preferably 5 times or less the average particle size of the electrically conductive particles at most. The size of the aggregate mentioned here also includes the maximum length of the aggregate in which the electrically conductive particles 3 are linked to one another.

Abrasion by Through Hole

In addition, a fine abrasion which is believed to be generated by friction with the through holes 12 is generated on the electrically conductive particles 3 in some cases. This abrasion is generated at approximately from 3 to 20% of the surface area of the electrically conductive particles 3. In addition, there are the abraded electrically conductive particles 3 at 0.5% or more of the total number of the electrically conductive particles, and the flow of the electrically conductive particles 3 is suppressed by this at the time of transfer to the binder resin 2 or at the time of thermal pressurization of the anisotropic conductive film 1. In addition, the conduction performance is not affected when the abraded electrically conductive particles 3 are within 30% of the total number of the electrically conductive particles, but it is preferable that the abraded electrically conductive particles 3 are within 15% of the total number of the electrically conductive particles.

Second Embodiment

Figure 6:
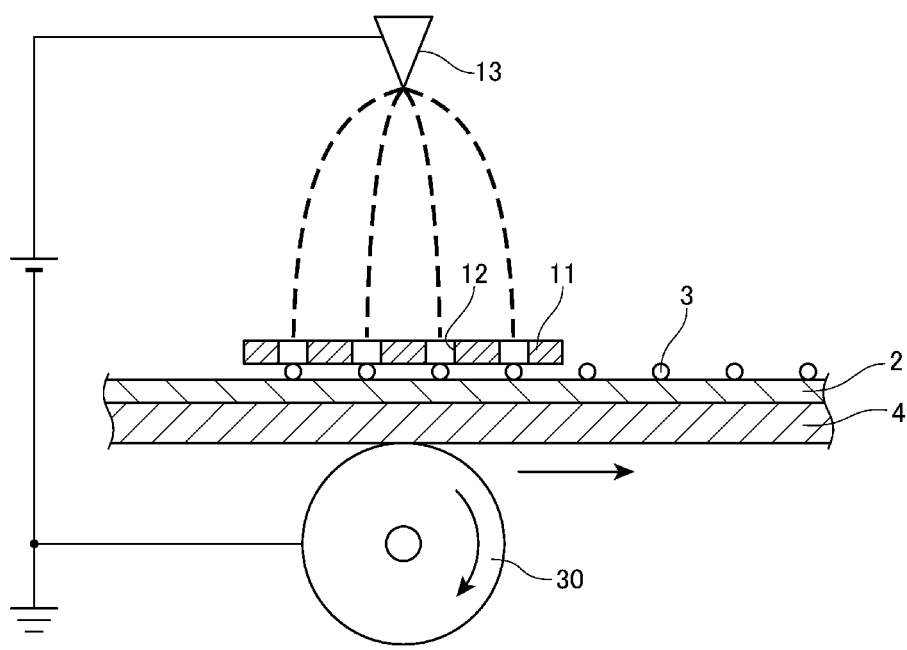
FIG. 6 is a cross-sectional view illustrating a manufacturing process using a roll-shaped support plate.
Figure 7A:
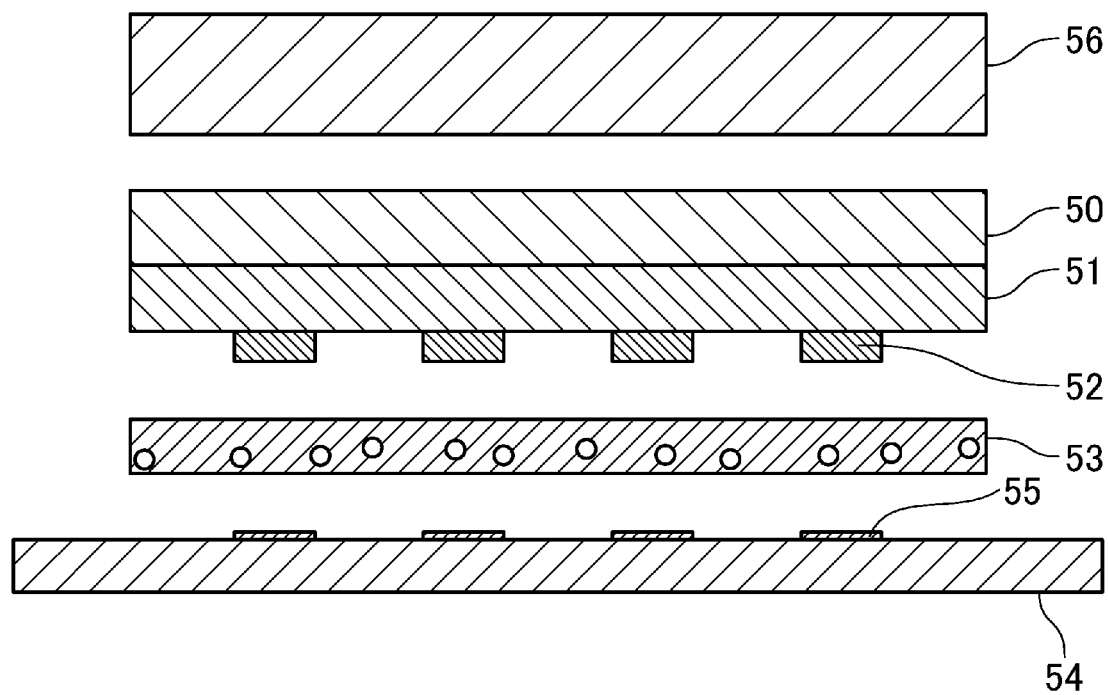
Figure 7B:
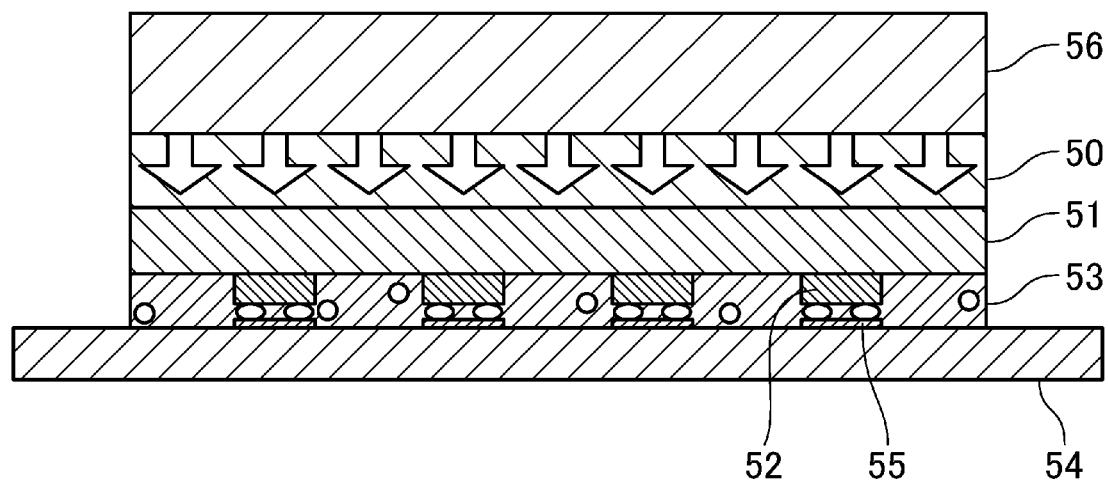
Figure 8A:
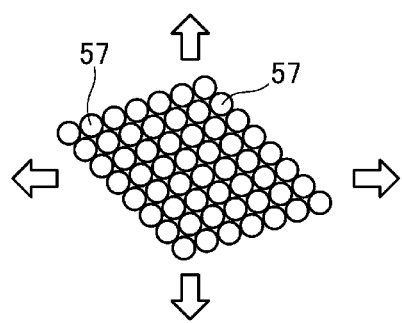
Figure 8B:
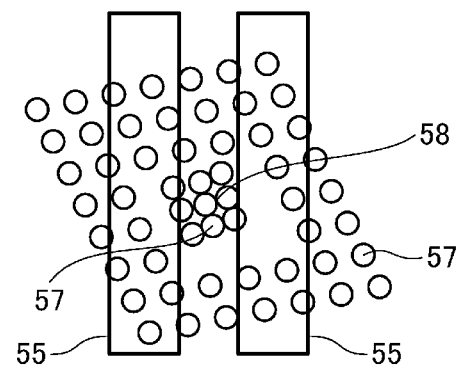

Incidentally, the support plate to support the first base film may be formed in a roll shape as illustrated in FIG. 6 in addition to a plate shape. The roll-shaped support plate 30 conveys the first base film 4 by being rotated. In addition, the array plate 11 is disposed on the upper part of the first base film 4 supported by the roll-shaped support plate 30. Furthermore, a voltage is applied between the roll-shaped support plate 30 and the spray 13 facing the array plate 11 such that the roll-shaped support plate 30 is charged in a polarity opposite to the electrical charge of the electrically conductive particles that are ejected from the spray 13.

Thereafter, the electrically conductive particles 3 ejected from the spray 13 pass through the through holes 12 of the array plate 11 and are attached onto the surface of the binder resin 2 provided on the base film 4 in a predetermined pattern when the first base film 4 moves on the upper part of the roll-shaped support plate 30. This makes it possible to continuously arrange the electrically conductive particles 3 on the binder resin 2 of the first base film 4 that is conveyed by the roll-shaped support plate 30, and thus it is possible to improve the manufacturing efficiency.

Furthermore, the first base film 4 in which the electrically conductive particles 3 are arranged on the surface of the binder is continuously subjected to the roll lamination of the second base film 5 and the light curing of the adhesive layer on the downstream side in the conveying direction in the same manner, and thus it is possible to continuously form the anisotropic conductive film 1 by a series of steps.

EXAMPLES

Subsequently, Examples of the invention will be described. In the present Examples, a plurality of the anisotropic conductive films which were manufactured by different manufacturing methods and had different configurations of the electrically conductive particles were prepared, and connector samples were manufactured in which an IC was connected onto a glass substrate using each of the anisotropic conductive films. Thereafter, the conduction resistance ($\Omega$) and the proportion (ppm) of short circuit between terminals were determined for each of the connector samples.

In the anisotropic conductive films according to Examples and Comparative Examples, a resin composition prepared by blending:

60 parts by mass of a phenoxy resin (YP-50, manufactured by NIPPON STEEL & SUMIKIN CHEMICAL CO., LTD.);

40 parts by mass of an epoxy resin (jER828, manufactured by Mitsubishi Chemical Corporation); and 2 parts by mass of a cationic curing agent (SI-60L, manufactured by SANSHIN CHEMICAL INDUSTRY CO., LTD.) was used as a binder resin.

As the anisotropic conductive films according to Examples and Comparative Examples, a mixed solution was prepared by adjusting the solid content of these resin compositions to be 50% with toluene, the mixed solution was coated on a PET film having a thickness of 50 μm, and the coated PET film was dried in an oven at 80° C. for 5 minutes, thereby obtaining an anisotropic conductive film containing a binder resin having a thickness of 20 μm.

In addition, in the anisotropic conductive films according to Examples and Comparative Examples, AUL704: (resin core Au plating particles, average particle size: 4 μm, manufactured by SEKISUI CHEMICAL CO., LTD.) was used as the electrically conductive particles.

A glass substrate (trade name: 1737F, manufactured by Corning Incorporated, size: 50 mm×30 mm, thickness: 0.5 mm) on which an aluminum wiring pattern corresponding to the pattern of the IC chip was formed was used as the glass substrate.

The connector sample to be used for the measurement of conduction resistance ($\Omega$) was manufactured as follows. The anisotropic conductive films according to Examples and Comparative Examples were disposed on this glass substrate, the IC chip (dimensions: 1.8 mm×20.0 mm, thickness: 0.5 mm, gold bump size: 30 μm×85 μm, bump height: 15 μm, pitch: 50 μm) was disposed on the anisotropic conductive film, and the resultant was heated and pressurized, thereby connecting the IC chip and the aluminum wiring patterned glass substrate to each other. The condition for pressure joining was 180° C., 80 MPa, and 5 seconds.

In addition, the connector sample to be used for the measurement of proportion (ppm) of short circuit between terminals was manufactured as follows. The anisotropic conductive films according to Examples and Comparative Examples were disposed on this glass substrate, the IC chip (size: 1.5 mm×13.0 mm, thickness: 0.5 mm, gold bump size: 25 μm×140 μm, bump height: 15 μm, pitch: 7.5 μm) was disposed on the anisotropic conductive film, and the resultant was heated and pressurized, thereby connecting the IC chip and the aluminum wiring patterned glass substrate to each other. The condition for pressure joining was 180° C., 80 MPa, and 5 seconds.

Example 1

In the manufacturing process of the anisotropic conductive film according to Example 1, the electrically conductive particles were arranged on the binder resin formed on one surface of a PET film in a predetermined pattern and then pushed into the binder resin by laminating a release-treated PET film on the surface on which the electrically conductive particles were arranged of the binder resin, thereby manufacturing the anisotropic conductive film.

For the arrangement of the electrically conductive particles, an electrically conductive support plate to support a PET film provided with a binder resin, an array plate which was disposed to face the binder resin of the PET film supported by the support plate and on which a plurality of through holes arranged in a pattern corresponding to the array pattern of the electrically conductive particles were formed, and a spray which was disposed above the array plate and sprayed the charged electrically conductive particles together with a liquid while applying a voltage to the electrically conductive particles were used (see FIG. 3).

Thereafter, the electrically conductive particles which were charged with an electrical charge were sprayed together with water from the spray while applying a voltage between the spray and the support plate. The ejected electrically conductive particles passed through the through holes of the array plate as well as were uniformly dispersed by the static electricity, and were attached onto the surface of the binder resin on the PET film supported by the support plate to which the opposite polarity was applied in a pattern corresponding to the array pattern of the through holes.

Thereafter, the electrically conductive particles 3 were pushed into the binder resin by laminating a release-treated PET film on the surface of the binder resin using a laminating roll, thereby obtaining the anisotropic conductive film.

This anisotropic conductive film was pasted on a plurality of connecting terminals by taking the parallel direction of the connecting terminals of an aluminum wiring pattern formed on a glass substrate as the longitudinal direction.

Here, in Example 1, the insulating film (polymethyl methacrylate) was formed on the surface of the electrically conductive particles in a thickness of 0.1% of the average particle size (4 μm) of the electrically conductive particles.

Example 2

In Example 2, the conditions were the same as those in Example 1 except that the thickness of the insulating film formed on the surface of the electrically conductive particles was 10% of the average particle size (4 μm) of the electrically conductive particles.

Example 3

In Example 3, the conditions were the same as those in Example 1 except that the thickness of the insulating film formed on the surface of the electrically conductive particles was 50% of the average particle size (4 μm) of the electrically conductive particles.

Comparative Example 1

In Comparative Example 1, an anisotropic conductive film was obtained by a manufacturing method of prior art. In other words, an anisotropic conductive film molded in a film shape was obtained by coating a resin composition prepared by dispersing electrically conductive particles (AUL704) in the binder resin described above on a PET film and drying it. In the anisotropic conductive film according to Comparative Example 1, the electrically conductive particles are randomly disposed in the binder resin.

Incidentally, in Comparative Example 1, the thickness of the insulating film formed on the surface of the electrically conductive particles was 10% of the average particle size (4 μm) of the electrically conductive particles.

This anisotropic conductive film was pasted on a plurality of connecting terminals by taking the parallel direction of the connecting terminals of an aluminum wiring pattern formed on a glass substrate as the longitudinal direction.

Comparative Example 2

In Comparative Example 2, a pressure sensitive adhesive layer was formed by coating an acrylic polymer on a 100 μm of unstretched copolymerized polypropylene film and drying it. The electrically conductive particles (AUL704) were filled all over this pressure sensitive adhesive material layer, and the electrically conductive particles that did not reach the pressure sensitive adhesive were removed by air blowing, thereby forming a single-layer electrically conductive particle layer having a filling rate of 60%.

Next, this polypropylene film on which the electrically conductive particles were fixed was stretched to 2.0 times at 135° C. and at a ratio of 10%/sec in both vertical and horizontal directions using a biaxial stretching apparatus for test and was gradually cooled up to room temperature, thereby obtaining an array sheet.

Next, a PET film coated with a binder resin (transfer film) was superimposed on the electrically conductive particle side of this array sheet and laminated under the condition of 60° C. and 0.3 MPa to embed the electrically conductive particles into the binder resin, and the polypropylene film and the pressure sensitive adhesive were peeled off therefrom. Thereafter, a second PET film was bonded on the PET film in the same manner as in Example 1, thereby obtaining an anisotropic conductive film.

This anisotropic conductive film was pasted on a plurality of connecting terminals by taking the parallel direction of the connecting terminals of an aluminum wiring pattern formed on a glass substrate as the longitudinal direction.

Incidentally, in Comparative Example 2, the thickness of the insulating film formed on the surface of the electrically conductive particles was 10% of the average particle size (4 μm) of the electrically conductive particles.

Comparative Example 3

In Comparative Example 3, the conditions were the same as those in Example 1 except that the thickness of the insulating film formed on the surface of the electrically conductive particles was 0.05% of the average particle size (4 μm) of the electrically conductive particles.

Comparative Example 4

In Comparative Example 4, the conditions were the same as those in Example 1 except that the thickness of the insulating film formed on the surface of the electrically conductive particles was 80% of the average particle size (4 μm) of the electrically conductive particles.

Connector samples were manufactured in which an IC was connected onto a glass substrate using these anisotropic conductive films according to the respective Examples and Comparative Examples. Thereafter, the conduction resistance (Ω) and the proportion (ppm) of short circuit between terminals were determined for each of the respective connector samples. The results are presented in Table 1.

Table 1

|  | Example 1 | Example 2 | Example 3 | Comparative Example 1 | Comparative Example 2 | Comparative Example 3 | Comparative Example 4 |
|---|---|---|---|---|---|---|---|
| Arrangement of electrically conductive particles | Equal disposition | Equal disposition | Equal disposition | Random disposition | Equal disposition | Equal disposition | Equal disposition |
| Thickness of insulating film with respect to size of electrically conductive particles(%) | 0.10 | 10 | 50 | 10 | 10 | 0.05 | 80 |
| Conduction resistance($\Omega$) | 0.2 | 0.2 | 0.5 | 0.2 | 0.2 | 0.2 | 0.2 |
| Proportion of short circuit between terminals(ppm) | 1 or less | 1 or less | 1 or less | 3000 | 300 | 130 | 1 or less |

As presented in Table 1, in all of Examples 1 to 3, the conduction resistance between the IC chip and the connecting terminal formed on the glass substrate was as low as 0.5Ω or less and the proportion of short circuit between the terminals was also 1 ppm or less.

On the other hand, in Comparative Example 1, although the conduction resistance was as low as 0.2Ω, the proportion of short circuit between the terminals was as frequent as 3000 ppm. In the same manner, in Comparative Example 2, although the conduction resistance was as low as 0.2Ω, the proportion of short circuit between the terminals was as frequent as 3000 ppm, and in Comparative Example 3 as well, although the conduction resistance was as low as 0.2Ω, the proportion of short circuit between the terminals was as frequent as 130 ppm. In addition, in Comparative Example 4, although the proportion of short circuit between the terminals was as rare as 1 ppm or less, the conduction resistance was as high as 2.0Ω.

This is because, in Examples 1 to 3, the anisotropic conductive films manufactured using the manufacturing process according to the invention were used, and thus the electrically conductive particles were equally dispersed and disposed in a pattern corresponding to the pattern of the through holes 12 of the array plate 11, a high particle capture rate was maintained even though the connecting terminal was microminiaturized and the interval between the connecting terminals was narrowed, and also it was possible to prevent a short circuit between terminals having a narrowed interval as the aggregation of particles was prevented.

On the other hand, in Comparative Example 1, the electrically conductive particles were randomly dispersed in the binder resin, and thus the locations at which the electrically conductive particles were concentrated and the locations at which the electrically conductive particles were dispersed were generated in the binder resin, the electrically conductive particles were linked to one another between the adjacent terminals having a narrowed interval, and thus a short circuit between terminals occurred as frequently as 3000 ppm.

In addition, in Comparative Example 2, not all of the electrically conductive particles were separated from one another by the method to separate the electrically conductive particles from one another by biaxial stretching, the aggregate of particles in which a plurality of electrically conductive particles were linked to one another remained, and the short circuit between the adjacent terminals having a narrowed interval occurred as frequently as 300 ppm, and thus it was not possible to completely prevent the short circuit.

In addition, in Comparative Example 3, the film thickness of the insulating film formed on the surface of the electrically conductive particles was less than 0.1% of the average particle size of the electrically conductive particles, thus the electrically conductive particles lost the electrostatic property after being ejected from the spray but before being attached onto the surface of the binder resin, and because of this, the electrically conductive particles were randomly scattered, and also the electrically conductive particles were not equally dispersed and disposed as a plurality of electrically conductive particles passed through one through hole. For this reason, in Comparative Example 3 as well, the aggregation of particles in which a plurality of electrically conductive particles were linked to one another occurred, thus a short circuit between adjacent terminals having a narrowed interval occurred as frequently as 130 ppm and it was not possible to completely prevent the short circuit.

In addition, in Comparative Example 4, the film thickness of the insulating film formed on the surface of the electrically conductive particles was thick to be 80% of the average particle size of the electrically conductive particles, and the thick insulating film inhibited the conduction properties when the anisotropic conductive film was sandwiched between the connecting terminals. For this reason, in Comparative Example 4, although the electrostatic property was favorable and the proportion of short circuit between the adjacent terminals was 1 ppm to be favorable, but the conduction resistance was as high as 2.0Ω.

From this, it can be seen that it is preferable that the thickness of the insulating film formed on the surface of the electrically conductive particles is 0.1% or more and 50% or less of the particle size of the electrically conductive particles.

REFERENCE SIGNS LIST

1 Anisotropic conductive film, 2 Binder resin, 3 Electrically conductive particles, 3a Insulating film, 4 First base film, 5 Second base film, 6 Take-up reel, 10 Support plate, 11 Array plate, 12 Through hole, 13 Spray, 21 Laminating roll, 22 rigid substrate, 23 Connecting terminal

The invention claimed is:
1. A method for manufacturing an electrically conductive adhesive film, the method comprising steps of:
providing a support plate to support a first base film having an adhesive layer formed on a surface;
providing an array plate that is disposed to face the adhesive layer of the first base film supported by the support plate and has a plurality of through holes arranged in a predetermined pattern;
providing a spray that is disposed on a side opposite to a side facing the support plate of the array plate and sprays electrically conductive particles together with a liquid while applying a voltage to the electrically conductive particles;

spraying the electrically conductive particles charged with an electrical charge from the spray; and arranging the electrically conductive particles which passed through the through holes of the array plate on the adhesive layer in an array pattern of the through holes, wherein a size of the through holes formed on the array plate is from 120 to 200% of the size of the electrically conductive particles.

2. The method for manufacturing an electrically conductive adhesive film according to claim 1, wherein a surface of the electrically conductive particles is covered with an insulating material.

3. The method for manufacturing an electrically conductive adhesive film according to claim 1, wherein the electrically conductive particles are sprayed while applying a voltage between the spray and the support plate supporting a surface on the opposite side to a surface on which the adhesive layer is formed of the first base film.

4. The method for manufacturing an electrically conductive adhesive film according to claim 2, wherein a thickness of an insulating film to cover the surface of the electrically conductive particles is from 0.1 to 50% of a particle size of the electrically conductive particles.

5. The method for manufacturing an electrically conductive adhesive film according to claim 1, wherein the array plate is prevented from being charged.

6. The method for manufacturing an electrically conductive adhesive film according to claim 1, wherein the support plate is formed in a roll shape and arrangement of the electrically conductive particles on the adhesive layer is continuously conducted while conveying the base film.

7. The method for manufacturing an electrically conductive adhesive film according to claim 1, wherein a second base film is laminated on the adhesive layer after the electrically conductive particles are arranged on the adhesive layer.

8. The method for manufacturing an electrically conductive adhesive film according to claim 1, wherein the support plate has an electrical conductivity.

9. The method of manufacturing a conductive adhesive film according to claim 1, wherein aggregates exist in which a plurality of the conductive particles are linked to one another, and a number of the plurality of conductive particles linked in the aggregates is within 15% of a total number of the conductive particles.

10. The method of manufacturing a conductive adhesive film according to claim 9, wherein a size of the aggregate is eight times or less the average particle size of the conductive particles.

* * * * *